US010797124B2

(12) United States Patent
Song et al.

(10) Patent No.: US 10,797,124 B2
(45) Date of Patent: Oct. 6, 2020

(54) ORGANIC LIGHT EMITTING DISPLAY SUBSTRATE AND MANUFACTURING METHOD THEREOF

(71) Applicant: BOE TECHNOLOGY GROUP CO., LTD., Beijing (CN)

(72) Inventors: Zhen Song, Beijing (CN); Guoying Wang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/457,139

(22) Filed: Jun. 28, 2019

(65) Prior Publication Data
US 2020/0052055 A1 Feb. 13, 2020

(30) Foreign Application Priority Data
Aug. 9, 2018 (CN) .......................... 2018 1 0902110

(51) Int. Cl.
H01L 27/32 (2006.01)
H01L 51/00 (2006.01)
H01L 51/52 (2006.01)

(52) U.S. Cl.
CPC ........ *H01L 27/3262* (2013.01); *H01L 27/322* (2013.01); *H01L 27/3246* (2013.01); *H01L 27/3272* (2013.01); *H01L 51/0096* (2013.01); *H01L 51/5203* (2013.01); *H01L 2227/323* (2013.01)

(58) Field of Classification Search
None
See application file for complete search history.

(56) References Cited

U.S. PATENT DOCUMENTS

2009/0278131 A1* 11/2009 Kwon ................ H01L 27/1288
257/72
2010/0200861 A1 8/2010 Lee et al.
2012/0080681 A1* 4/2012 Kim .................... H01L 27/3262
257/59
2015/0060863 A1* 3/2015 Li .......................... H01L 27/124
257/71

(Continued)

FOREIGN PATENT DOCUMENTS

CN 101859793 A 10/2010
CN 104022126 A 9/2014
CN 107731881 A 2/2018

OTHER PUBLICATIONS

Office Action dated Mar. 12, 2020 issued in corresponding Chinese Application No. 201810902110.5.

*Primary Examiner* — Benjamin P Sandvik
(74) *Attorney, Agent, or Firm* — Nath, Goldberg & Meyer; Joshua B. Goldberg

(57) ABSTRACT

The present application provides an organic light emitting display substrate and a method of fabricating the same. The organic light emitting display substrate includes: a base substrate; and a driving transistor provided on the base substrate, wherein the driving transistor includes: an active layer; a first insulating layer having at least one sub-layer covering the active layer and having a first via hole therein; and a source electrode and a drain electrode disposed on a side of the first insulating layer distal to the base substrate, and connected to the active layer through the first via hole in the first insulating layer.

15 Claims, 4 Drawing Sheets

(56) References Cited

U.S. PATENT DOCUMENTS

| | | | |
|---|---|---|---|
| 2015/0129883 A1* | 5/2015 | Kimura | G02F 1/133345 |
| | | | 257/72 |
| 2016/0276376 A1 | 9/2016 | Sun et al. | |
| 2017/0110522 A1* | 4/2017 | Lee | H01L 51/5271 |
| 2018/0122888 A1* | 5/2018 | Jung | H01L 27/3272 |
| 2018/0190737 A1* | 7/2018 | Yang | H01L 51/105 |
| 2019/0214504 A1* | 7/2019 | Song | H01L 29/78633 |
| 2019/0386240 A1 | 12/2019 | Wang | |

* cited by examiner

ORGANIC LIGHT EMITTING DISPLAY SUBSTRATE AND MANUFACTURING METHOD THEREOF

CROSS-REFERENCE TO RELATED APPLICATIONS

The present application claims the priority of Chinese Patent Application No. 201810902110.5, filed on Aug. 9, 2018, the contents of which are incorporated herein in their entirety by reference.

TECHNICAL FIELD

The present application relates to a field of display technologies, and in particular, to an organic light emitting display substrate and a method of fabricating the same.

BACKGROUND

At present, an organic light-emitting display device including an active-matrix organic light emitting diode (AMOLED) has excellent characteristics in power consumption and displaying. Therefore, the organic light-emitting display device is applied more and more widely.

SUMMARY

The present disclosure provides an organic light emitting display substrate, including: a base substrate; a driving transistor, disposed on the base substrate, wherein the driving transistor includes: an active layer; a first insulating layer having at least one sub-layer covering the active layer and having a first via hole therein; and a source electrode and a drain electrode disposed on a side of the first insulating layer distal to the base substrate, and connected to the active layer through the first via hole in the first insulating layer, wherein the drain electrode includes a first region and a second region, the source electrode and the first region of the drain electrode includes a metal layer and a transparent conductive layer stacked together and having patterns substantially the same with each other, the transparent conductive layer being on a side of the metal layer proximal to the base substrate, the second region includes the transparent conductive layer, and the transparent conductive layer in the second region serves as a first electrode.

In an embodiment, the second region of the drain electrode does not include the metal layer.

In an embodiment, the transparent conductive layer and the metal layer stacked together are provided on a bottom and side surfaces of the first via hole.

In an embodiment, a side of the second region distal to the base substrate is sequentially covered by an organic light-emitting layer and a second electrode, wherein the first electrode, the organic light-emitting layer and the second electrode forms an organic light emitting diode.

In an embodiment, sub-layers of the first insulating layer include: an interlayer dielectric layer and a planarization layer.

In an embodiment, the organic light emitting display substrate further includes a color filter layer corresponding to the second region and located between the transparent conductive layer and the base substrate.

In an embodiment, the active layer includes: a non-conductor region and conductor regions, the non-conductor region corresponding to a gate electrode of the driving transistor, and the conductor regions are respectively connected to the source electrode and the drain electrode, and the organic light emitting display substrate further includes: a light blocking layer disposed between the active layer and the base substrate, wherein the light blocking layer is provided opposite to the active layer to form a capacitor.

In an embodiment, the light blocking layer is electrically connected to the gate electrode.

In an embodiment, the light blocking layer is electrically connected to the drain electrode.

In an embodiment, the organic light emitting display substrate further includes a buffer layer disposed between the light blocking layer and the active layer, the light blocking layer is connected to the drain electrode through a second via hole penetrating through the first insulating layer and the buffer layer.

In an embodiment, the transparent conductive layer and the metal laser stacked together are provided on a bottom and side surfaces of the second via hole.

In an embodiment, a side surface of the first via hole connects to a side surface of the second via hole such that the first via hole communicates with the second via hole to form a stepped joint via hole.

In an embodiment, the organic light-emitting display substrate further includes a color filter layer disposed between the buffer layer and the transparent conductive layer, wherein the color filter layer corresponds to the second region, and at least one side of the color filter layer extends to a side surface of the joint via hole.

The present disclosure further provides a method of fabricating the organic light emitting display substrate described above, including: forming the active layer; forming the first insulating layer, and forming the first via hole connected to the active layer in the first insulating layer; forming a transparent conductive material layer and a metal material layer on the first insulating layer and in the first via hole; removing the transparent conductive material layer and the metal material layer on a region other than the source electrode and the drain electrode; and removing the metal material layer of the second region.

In an embodiment, the removing the metal material layer of the second region includes: forming a second insulating layer covering the metal material layer; forming a pixel defining layer covering the second insulating layer; forming an opening of the pixel defining layer, the opening corresponding to the second region; and removing the second insulating layer and the metal material layer in the second region by using the pixel defining layer as a mask.

In an embodiment the method of fabricating an organic light emitting display substrate further includes forming the organic light-emitting layer and the second electrode sequentially in the second region.

The present disclosure further provides a display device, including the organic light emitting display substrate described above.

DETAILED DESCRIPTION

The present disclosure will be further described in detail below in conjunction with the drawings and specific embodiments.

In the present disclosure, "patterning process" refers to a process of forming a structure having a specific pattern, which may be a photolithography process. The photolithography process includes one or more of: a step of forming a material layer, a step of coating photoresist, a step of exposing, a step of developing, a step of etching, a step of photoresist stripping, and the like. Of course, the "patterning process" may also be other processes such as an imprint process, an inkjet printing process, and the like.

Figure 1:
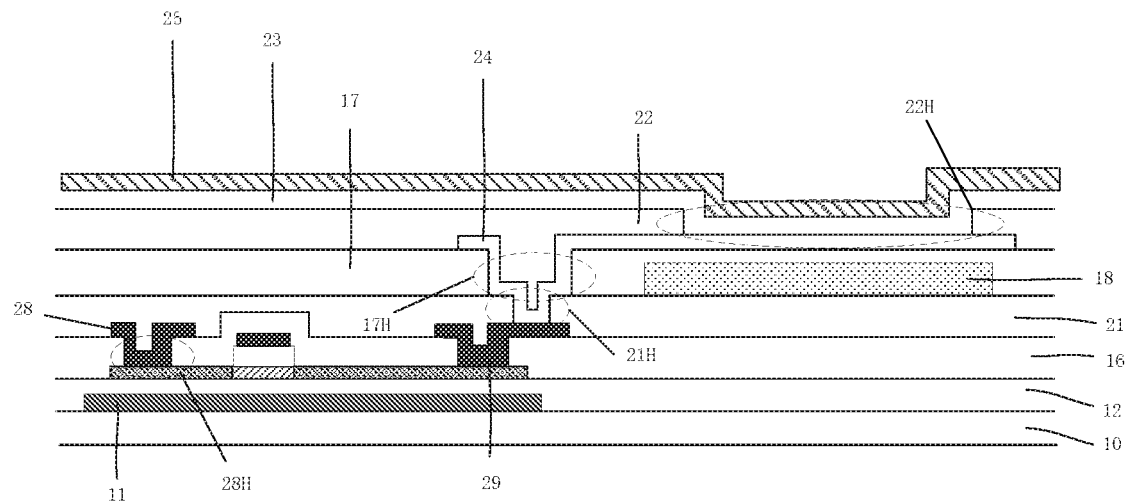
FIG. 1 is a cross-sectional view illustrating a structure of an organic light emitting display substrate.

A cross-sectional view illustrating a structure of an organic light emitting display substrate is shown in FIG. 1. The light emitting display substrate includes a driving transistor (such as, a thin film transistor) and a light emitting structure (an organic light emitting diode), and a first electrode (such as an anode) of the light emitting structure is connected to a drain electrode of the driving transistor. In a step of fabricating the light-emitting display substrate, it may be necessary to form via holes (for example, via holes 17H, 21H, 22H, and 28H) multiple times, to connect the source electrode and the drain electrode to the active layer and connect the first electrode to the drain electrode, thus a number of masks to be used is relatively large. It can be seen that, there are many steps in a manufacturing process of the light-emitting display substrate and the process is complicated.

Further, in the above-described organic light-emitting display substrate, light emitted from the light-emitting structure needs to pass through a plurality of layers to be emitted from a base substrate of the organic light-emitting display device. A number of layers through which the light needs to pass is large, which may cause a decrease in luminance.

Figure 2A:
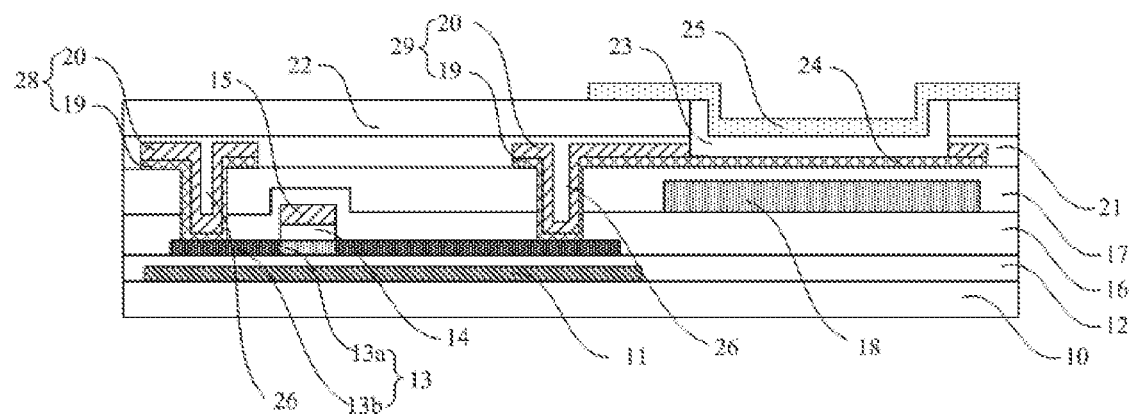
FIG. 2a is a cross-sectional view illustrating a structure of an organic light emitting display substrate according to an embodiment of the present disclosure.
Figure 2B:
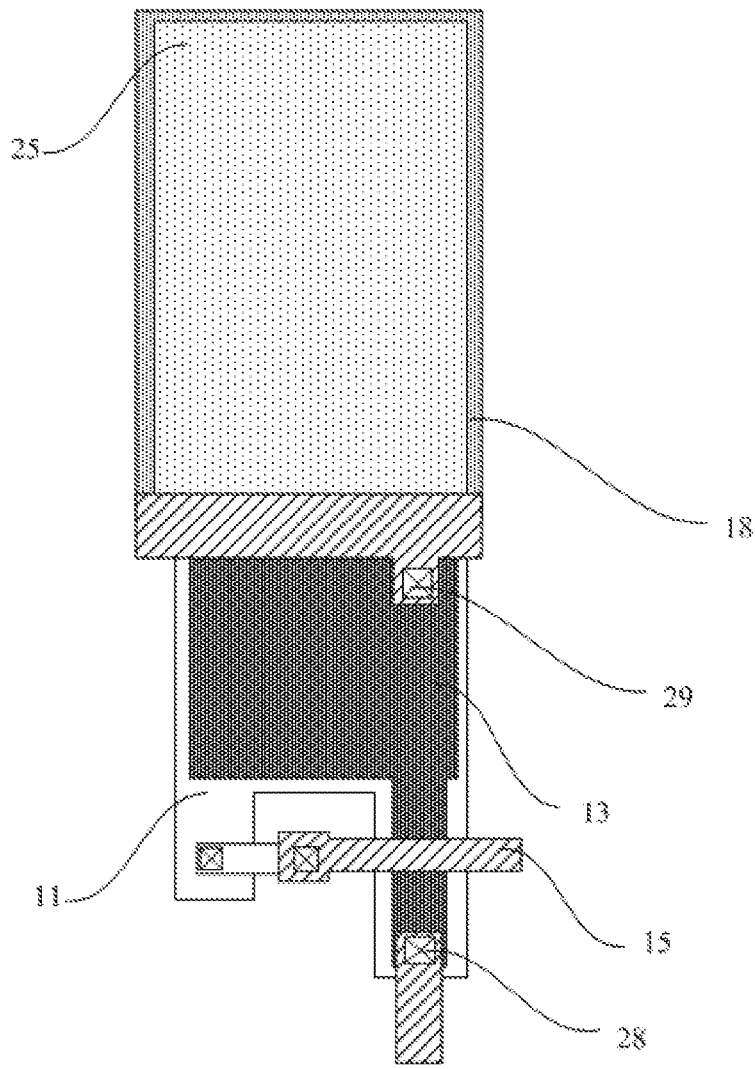
FIG. 2b is a top view illustrating a structure of an organic light emitting display substrate according to an embodiment of the present disclosure.

In this regard, an embodiment of the present disclosure provides an organic light emitting display substrate, as shown in FIG. 2a and FIG. 2b, the organic light emitting display substrate includes: a base substrate 10 and a driving transistor disposed on the base substrate 10, wherein the driving transistor includes: an active layer 13; a first insulating layer having at least one sub-layer covering the active layer and having a first via hole 26 therein; and a source electrode 28 and a drain electrode 29 disposed on a side of the first insulating layer distal to the base substrate 10, and connected to the active layer through the first via hole 26 in the first insulating layer.

The drain electrode 29 includes a first region and a second region, the source electrode 28 and the first region of the drain electrode 29 includes a metal layer 20 and a transparent conductive layer 19 stacked together and having patterns substantially the same with each other, the transparent conductive layer 19 being on a side of the metal layer 20 proximal to the base substrate 10, the second region includes the transparent conductive layer 19 and does not include the metal layer 20, the transparent conductive layer 19 in the second region serves as a first electrode 24. It should be understood that "substantially the same" means that a certain process error, for example within 10%, may be allowable.

The transparent conductive layer 19 and the metal layer 20 stacked together are provided on a bottom and side surfaces of the first via hole 26.

A side of the second region distal to the base substrate 10 is sequentially covered by an organic light-emitting layer 23 and a second electrode 25, wherein the first electrode 24, the organic light-emitting layer 23 and the second electrode 25 forms an organic light emitting diode.

In an embodiment, the source electrode 28 and the drain electrode 29 of the driving transistor are located on an upper surface of the first insulating layer and are respectively located at both ends of the active layer 13, the source electrode 28 and the drain electrodes 29 are respectively connected to the active layer 13 at a position of the first via hole 26. A gate electrode 15 of the driving transistor may be located above the active layer 13, and a gate electrode insulating layer 14 is provided between the active layer 13 and the gate electrode 15.

An upper surface of the transparent conductive layer 19 in the second region is not covered by the metal layer 20, and the transparent conductive layer 19 in the second region may serve as the first electrode 24 (e.g., an anode). The upper surface of the transparent conductive layer 19 in the second region is covered by the organic light-emitting layer 23, and the organic light-emitting layer 23 is covered by the second electrode 25 (e.g., a cathode). The first electrode 24, the organic light-emitting layer 23, and the second electrode 25 may form an organic light emitting diode.

In comparison with the configuration of the organic light-emitting display substrate illustrated in FIG. 1, the above configuration of the organic light-emitting display substrate according to the embodiment of the present disclosure may implement a first via hole 28H and a second via hole 17H shown in FIG. 1 by using one mask, implement the source electrode 28, the drain electrode 29 and the first electrode 24 by using one mask, and implement a third via hole 22H and a fourth via hole 21H by using one mask. Thereby, a number of masks to be used can be reduced, and processing steps can be reduced, thus costs can be reduced.

Further, in the organic light emitting display substrate according to an embodiment of the present disclosure, light emitted from the organic light emitting diode can be emitted from the base substrate 10 of the substrate through a small number of layers. Since a number of layer structures through which the light passes is relative small, loss of light is reduced, and thus luminance can be increased. In addition, since the number of layer structures is relative small, a height difference at a crossover line in the active layer is small, so that uniformity of display can be well ensured.

Further, in the organic light-emitting display substrate according to the embodiment of the present disclosure, the transparent conductive layer 19 and the metal layer 20 are in close contact, the conductive property of the metal layer 20 is strong, so that an electrical conductivity between the driving transistor and the organic light emitting diodes can be enhanced, which may improve a performance of the light emitting display substrate and reduce energy loss.

The transparent conductive layer 19 and the metal layer 20 in the above drain electrode 29 may be formed by using an existing material (such as Cu) and an existing process, that is, the process difficulty is not increased.

In an embodiment, the metal layer 20 locates outside an edge of the second region. The metal layer 20 may cause a subsequently formed insulating layer (e.g., a second insulating layer 21) indent inwardly (e.g., in a direction extending along the metal layer 20 and away from the organic light-emitting layer), to deteriorate a deposition of the organic light-emitting layer 23 around the second region, thereby increasing a resistance thereof, which helps to solve a problem of brightening around a pixel.

In an embodiment, the first insulating layer includes an interlayer dielectric layer 16 and a planarization layer 17. Thus, the interlayer dielectric layer 16 and the planarization layer 17 may also be referred to as sub-layers of the first insulating layer.

The planarization layer 17 is provided on a surface of the interlayer dielectric layer 16 distal to the base substrate 10, that is, the planarization layer 17 is provided on an upper surface of the interlayer dielectric layer 16. The planarization layer 17 may cover other structural layers on the upper surface of the interlayer dielectric layer 16.

The planarization layer 17 may have a substantially flat upper surface. A planarization process may further be perform on the planarization layer 17 to flatten the upper surface of the planarization layer 17, which is beneficial not only for light emission of the organic light emitting diode but also for process steps after a formation of the planarization layer 17.

Additionally, since the interlayer dielectric layer 16 and the planarization layer 17 separate the source electrode 28 and the drain electrode 29 from the gate electrode 15, a distance between the source electrode 28, the drain electrode 29 and the gate electrode 15 is increased, thus short circuit due to break through would not easily occur therebetween. Thereby, a density standard of the interlayer dielectric layer 16 directly covering the gate electrode 15 can be reduced, or a thickness thereof can be reduced; also, a temperature used in a preparation process of the interlayer dielectric layer 16 (such as a PECVD process) can be lowered, thereby, oxidation of the gate electrode 15 (which is made of, for example, copper) in a process of forming the interlayer dielectric layer 16 can be avoided, an occurrence of disconnection of the gate electrode 15 can be avoided, performance degradation of the active layer 13 can be avoided, and parasitic resistance can be reduced.

In an embodiment, the organic light emitting display substrate further includes a color filter layer 18 corresponding to the second region and located between the transparent conductive layer 19 and the base substrate 10.

In an embodiment, the color filter layer 18 may be located on a side of the interlayer dielectric layer 16 distal to the base substrate 10 (in this case, the organic light emitting display substrate is in a form of, for example, "bottom emission", which means that light is emitted through the base substrate 10). That is, the color filter layer 18 may be located on an upper surface of the interlayer dielectric layer 16, and the planarization layer 17 covers the color filter layer 18. A position of the color filter layer 18 corresponds to the second region, so that light emitted from the organic light emitting diode is emitted through the color filter layer 18.

Specifically, the color filter layer 18 can be a corresponding color according to actual conditions, such as red, yellow, and the like.

In an embodiment, the active layer 13 includes a non-conductor region 13a and a conductor region 13b, the non-conductor region 13a corresponds to the gate electrode 15, and the source electrode 28 and the drain electrode 29 are connected to the conductor region 13b. The non-conducting region 13a may have properties of a semiconductor, that is, it conducts electricity under a certain condition. The conductor region 13b may have properties of a conductor, that is, it conducts electricity. The non-conductor region 13a and the conductor region 13b are connected to each other to constitute an integral active layer 13.

The organic light emitting display substrate may further include a light blocking layer 11 provided between the active layer 13 and the base substrate 10, and the light blocking layer 11 can prevent the active layer 13 from being irradiated with light, and thus prevent the active layer 13 from performance degrade. The light blocking layer 11 may also be disposed opposite to the active layer 13 to form a capacitor. The capacitor formed by the conductor region 13b of the active layer 13 and the light blocking layer 11 can improve performance of the organic light emitting diode.

In an embodiment, the light blocking layer 11 is electrically connected to the gate electrode 15. Specifically, a certain edge of the light blocking layer 11 may include a region connected to the gate electrode 15, and the upper surface of the region may not be covered by the active layer 13 and the gate electrode insulating layer 14, as shown in FIG. 2b. The electrical connection between the light blocking layer 11 and the gate electrode 15 can prevent floating of the light blocking layer 11 and ensure effectiveness of the capacitor formed by the light blocking layer 11 and the active layer 13.

In a method of fabricating the organic light-emitting display substrate of an embodiment of the present disclosure, advantages of conductive material (for example, a conductive material forming the gate electrode 15 and the transparent conductive layer 19, etc.) are retained, while complexity of the process is not increased.

As shown in FIG. 3a to FIG. 3f, an embodiment of the present disclosure further provides a method for fabricating the organic light emitting display substrate, which includes following steps S10-S70.

Figure 3A:
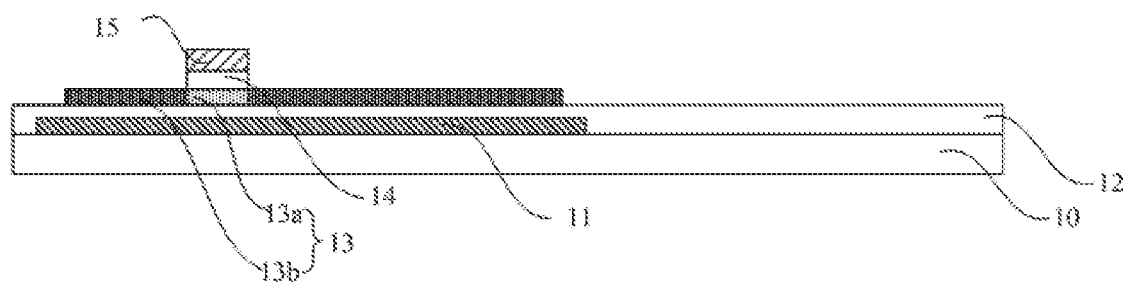
FIGS. 3a to 3f are cross-sectional views corresponding to respective steps of a method of fabricating an organic light emitting display substrate according to an embodiment of the present disclosure.

At step S10, as shown in FIG. 3a, the light blocking layer 11, a buffer layer 12, the active layer 13, the gate electrode insulating layer 14, and the gate electrode 15 are formed on the base substrate 10 by a patterning process. The step S10 may include steps S11-S15.

Specifically, at step S11, the light blocking layer 11 is formed on the upper surface of the base substrate 10. The base substrate 10 in the present disclosure may be made of a transparent flexible material, for example, a transparent resin material. The light blocking layer 11 may be made of metal, for example, copper.

At step S12, the buffer layer 12 is formed on the upper surface of the base substrate 10 and the light blocking layer 11. The buffer layer 12 covers the light blocking layer 11 and the upper surface of the base substrate 10. The buffer layer 12 can prevent metal atoms or impurities from diffusing from the light blocking layer 11 or the base substrate 10 into layer structures above the upper surface thereof, and flatten the upper surface to be formed with the layer structures thereon. The buffer layer 12 can be formed of a variety of materials that can accomplish this function.

At step S13, the active layer 13 is formed on the upper surface of the buffer layer 12 according to a predetermined pattern, wherein the active layer 13 may correspond to a position of the light blocking layer 11. An area of the active layer 13 may be slightly smaller than an area of the light blocking layer 11, and the active layer 13 may include the non-conductor region 13a and the conductor region 13b. The active layer 13 may be formed of an organic semiconductor, an oxidized semiconductor, or the like, such as amorphous indium gallium zinc oxide (a-IGZO), indium zinc tin oxide (IZTO), amorphous silicon (a-Si), polycrystalline silicon (p-Si), hexathiophene, polythiophene, and the like. The conductor region 13b is formed by a special process of transforming a semiconductor material into conductor material, such that the conductor region 13b of the active layer 13 and the light blocking layer 11 form a capacitor.

At step S14, a gate electrode insulating layer 14 is formed on the non-conducting region 13a of the active layer 13. The gate electrode insulating layer 14 is made of an insulating material, such as an oxide or a nitride.

At step S15, a gate electrode 15 is formed on the upper surface of the gate electrode insulating layer 14. The gate electrode insulating layer 14 separates the gate electrode 15 from the active layer 13. The gate electrode 15 may be formed of a high-conductive material, such as a metal. The driving transistor formed according to the method of the embodiment of the present disclosure has a top gate structure, and it should be understood that, the driving transistor formed according to an embodiment of the present disclosure may also have a bottom gate structure.

Figure 3B:
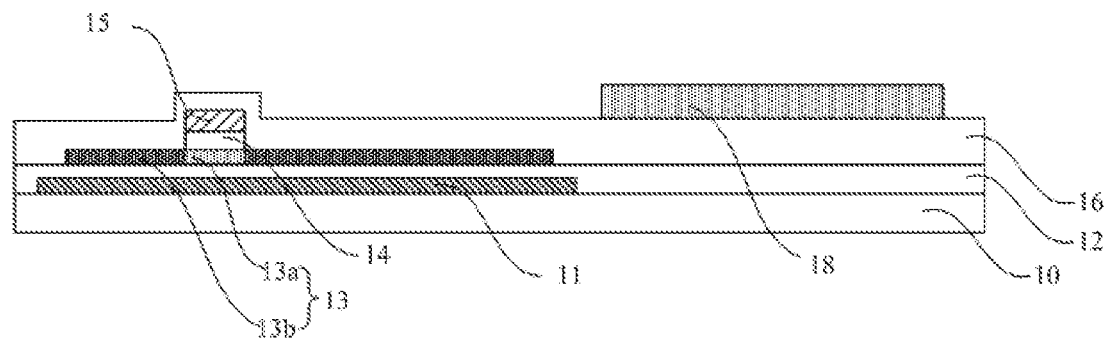

At step S20, as shown in FIG. 3b, the interlayer dielectric layer 16 and the color filter layer 18 are formed. The step S20 may include steps S21-S22.

Specifically, at step S21, the interlayer dielectric layer 16 is formed to cover the gate electrode 15, the gate electrode insulating layer 14, the active layer 13, and the buffer layer 12. The interlayer dielectric layer 16 includes, but is not limited to, any material which can result in a planarization effect, such as a silicone-based material, an acrylic-based material, or a polyimide-based material.

At step S22, a color filter layer 18 is formed on the upper surface of the interlayer dielectric layer 16. The color filter layer 18 may be distal to an area where the active layer 13 is located. The color filter layer 18 corresponds to the second region.

Figure 3C:
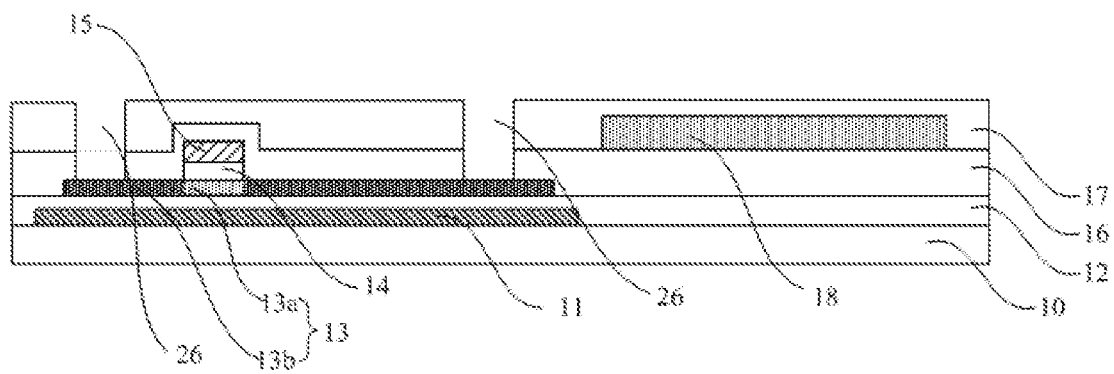

At step S30, as shown in FIG. 3c, a planarization layer 17 is formed. The step S30 may include steps S31-S32.

Specifically, at step S31, a planarization layer 17 is formed to cover the upper surface, side surfaces of the color filter layer 18, and an exposed upper surface of the interlayer dielectric layer 16, and flatten the color filter layer 18 and the interlayer dielectric layer 16. A material for the planarization layer 17 includes, but is not limited to, a material which can result in a planarization effect, such as a silicone-based material, an acrylic-based material, or a polyimide-based material.

At step S32, two first via holes 26 are formed in the planarization layer 17 and the interlayer dielectric layer 16 according to a predetermined pattern, exposing upper surfaces of two separated regions of the active layer 13. The two first via holes 26 are respectively located on both ends of the active layer 13 in FIG. 3c.

Figure 3D:
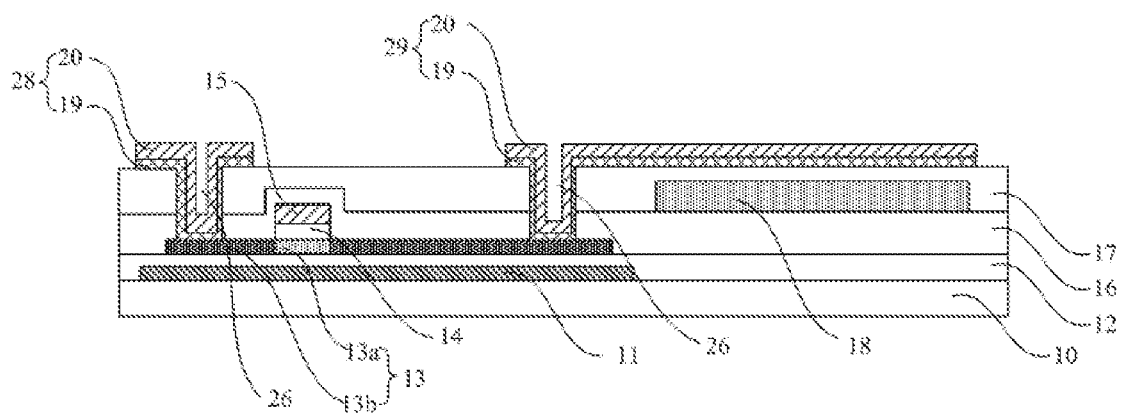

At step S40, as shown in FIG. 3d, the gate electrode 15, the source electrode 28 and the drain electrode 29 are formed. The step S40 may include steps S41-S43.

Specifically, at step S41, a transparent conductive material layer is formed on the planarization layer 17 and in the first via hole 26, such that the transparent conductive material layer covers the upper surface of the planarization layer 17, the bottom and side surfaces of the first via hole 26. At the bottom of the first via hole 26, the transparent conductive material layer is in direct contact with the exposed active layer 13. The transparent conductive material layer is used to form the transparent conductive layer 19 described above.

At step S42, a metal material layer is formed on the transparent conductive material layer, and the metal material layer covers the transparent conductive material layer, that is, the metal material layer has a pattern the same as that of the transparent conductive material layer. The metal material layer is used to form the metal layer 20 described above. The metal material layer may be made of a commonly used metal, such as silver (Ag), copper (Cu), aluminum (Al), molybdenum (Mo), or the like.

At step S43, the transparent conductive material layer and the metal material layer between the two first via holes 26 are removed according to a predetermined pattern to form the source electrode 28 and the drain electrode 29. That is, the transparent conductive material layer and the metal material layer on regions other than the source electrode 28 and the drain electrode 29 may be removed.

Figure 3E:
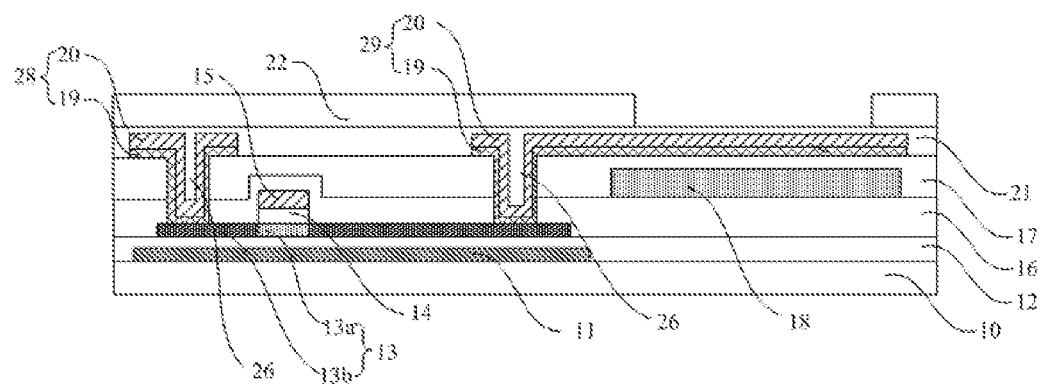

At step S50, as shown in FIG. 3e, a second insulating layer 21 and a pixel defining layer 22 are formed. The step S50 may include steps S51-S52.

Specifically, at step S51, a second insulating layer 21 is formed on the source electrode 28 and the drain electrode 29, and the second insulating layer 21 separates the source electrode 28 from the drain electrode 29, and covers the source electrode 28 and the drain electrode 29, to flatten the formed structure. The second insulating layer 21 is made of an insulating material, such as an oxide or a nitride.

At step S52, an opening of the pixel defining layer 22 is formed, the opening corresponding to the second region, that is, the pixel defining layer 22 is formed on the upper surface of the second insulating layer 21, and a portion of the pixel defining layer 22 corresponding to the second region is removed according to a predetermined pattern. The pixel defining layer 22 is used to separate light emitting regions of adjacent sub-pixels of the organic light emitting display substrate from each other.

Figure 3F:
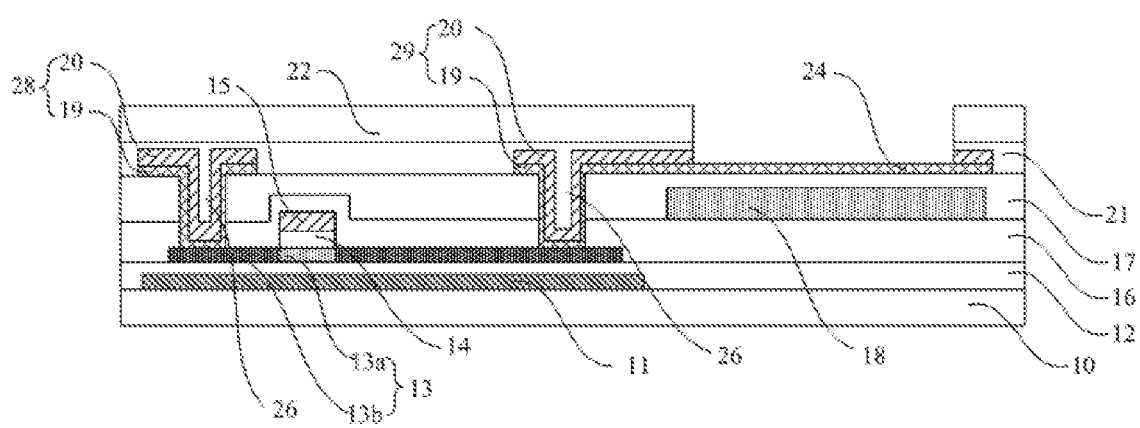

At step S60, as shown in FIG. 3f, the first electrode 24 is formed.

Specifically, the pixel defining layer 22 may be used as a mask to remove the metal material layer of the second region, to expose the transparent conductive material layer of the second region. The exposed transparent conductive material layer serves as the first electrode 24.

At step S70, as shown in FIG. 2a, the organic light-emitting layer 23 and the second electrode 25 are formed. The step S70 may include steps S71-S72.

Specifically, at step S71, the organic light-emitting layer 23 is formed on the exposed transparent conductive layer 19.

At step S72, a second electrode 25 is formed on the upper surface of the organic light-emitting layer 23 and the upper surface of a portion of the pixel defining layer. The organic light-emitting layer 23 separates the first electrode 24 from the second electrode 25 to form the organic light emitting diode.

In addition, the gate electrode 15, the source electrode 28, the drain electrode 29, the first electrode 24, and the second electrode 25 in the present disclosure may be formed of commonly used metal materials, such as Ag, Cu, Al, Mo, etc., or be formed of a plurality of layers of metals, such as molybdenum-Niobium alloy (MoNb)/Cu/MoNb, etc., or be formed of alloy materials of the above metals, such as AlNd, MoNb, etc., or be formed of a stacked structure of a metal and a transparent conductive oxide (such as indium tin oxide (ITO), aluminum doped zinc oxide (AZO)), such as ITO/Ag/ITO. A material of the buffer layer 12, the interlayer dielectric layer 16, the first insulating layer, and the second insulating layer 21 in the present disclosure may include, but is not limited to, conventional dielectric material such as silicon oxide (SiOx), silicon nitride (SiNx), silicon oxynitride (SiON), or various novel organic insulating materials, or a high dielectric constant (high k) material such as aluminum oxide (AlOx), hafnium oxide (HfOx), tantalum oxide (TaOx), or the like.

In the method of fabricating the organic light emitting display substrate according to an embodiment of the present disclosure, in a process of implementing connection between the source electrode 28, the drain electrode 29 and the active layer 13 and connection between the drain electrode 29 and the first electrode 24, merely one step involves forming the first via hole 26, and other via holes on other structures (for example, two via holes formed as shown in FIG. 1 may require at least two steps) are not required; moreover, the step of forming the first electrode 24, which includes removing the metal material layer by using the pixel defining layer 22 as a mask, is simple, and further simplifies fabrication process. In summary, the method of the present disclosure can reduce a number of masks to be used, simplify process steps, and reduce costs.

Figure 4:
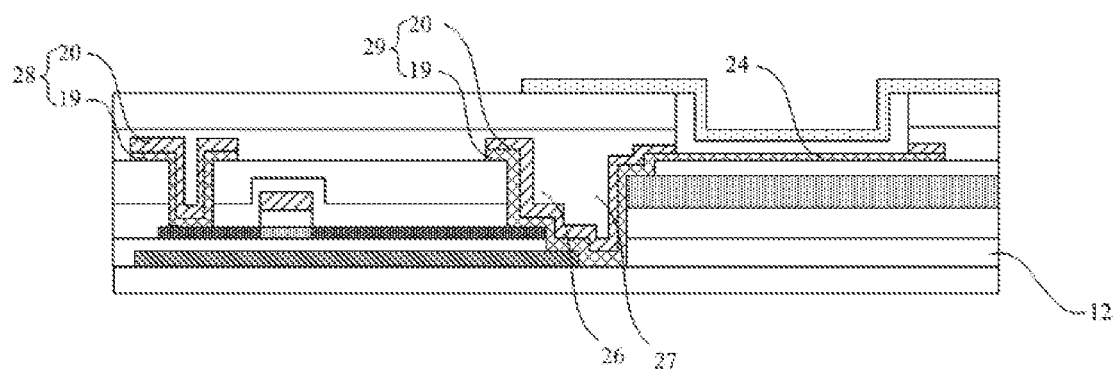
FIG. 4 is a cross-sectional view illustrating a structure of an organic light emitting display substrate according to another embodiment of the present disclosure.

As shown in FIG. 4, an embodiment of the present disclosure further provides another organic light emitting display substrate having a structure similar to that of the organic light emitting display substrate described in conjunction with FIG. 2a and FIG. 2b, except that the light blocking layer 11 and the drain electrode 29 are electrical connected in FIG. 4.

Specifically, the organic light emitting display substrate of an embodiment of the present disclosure further includes: the buffer layer 12 disposed between the light blocking layer 11 and the active layer 13, and the light blocking layer 11 is connected to the drain electrode 29 through a second via hole 27 penetrating through the first insulating layer and the buffer layer 12.

The buffer layer 12 may cover the entire base substrate 10. The buffer layer 12 can prevent metal atoms or impurities from diffusing from the light blocking layer 11 or the base substrate 10 into the active layer 13, thereby ensuring a performance of the organic light emitting display substrate. At the same time, the buffer layer 12 separates the light blocking layer 11 from the active layer 13 to form a capacitor.

In an embodiment, a side surface of the first via hole 26 connects to a side surface of the second via hole 27 such that the first via hole 26 communicates with the second via hole 27 to form a stepped joint via hole. Specifically, the first via hole 26 and the second via hole 27 may be two via holes arranged in parallel, wherein the first via hole 26 penetrates through the first insulating layer, and the second via hole 27 penetrates through the first insulating layer and the buffer layer; therefore, a depth of the second via hole 27 is greater than a depth of the first via hole 26. When the side surface of the first via hole 26 connects to the side surface of the second via hole 27 such that the first via hole 26 communicates with the second via hole 27, a stepped joint via hole can be formed. The drain electrode 29 connects the active layer 13 and the light blocking layer 11 through the joint via hole.

The first via hole 26 and the second via hole 27 may be formed in a single step, thereby simplifying process and reducing cost.

In an embodiment, the organic light emitting display substrate further includes: a color filter layer 18 disposed between the buffer layer 12 and the drain electrode 29. The color filter layer 18 corresponds to the second region, and at least one end of the color filter layer 18 extends to a side surface of the joint via hole.

That is, one side surface of the color filter layer 18 is in contact with the drain electrode 29 through the joint via hole. The drain electrode 29 includes a metal layer 20 that is reflective, such that light exiting from the side surface of the color filter layer 18 may be reflected back into the color filter layer 18 by the metal layer 20 of the drain electrode 29 to improve light utilization.

The present disclosure further provides a display device which includes the organic light emitting display substrate described in above embodiments.

It can be understood that the foregoing embodiments are merely exemplary embodiments used for describing the principle of the present disclosure, but the present disclosure is not limited thereto. Those ordinary skilled in the art can make various variations and improvements without departing from the spirit and essence of the present disclosure, and these variations and improvements shall fall into the protection scope of the present disclosure.

What is claimed is:

1. An organic light emitting display substrate, comprising:
   a base substrate;
   a driving transistor, disposed on the base substrate, wherein the driving transistor comprises:
   an active layer;
   a first insulating layer having at least one sub-layer covering the active layer and having a first via hole therein;
   a source electrode and a drain electrode disposed on a side of the first insulating layer distal to the base substrate, and connected to the active layer through the first via hole in the first insulating layer, wherein the drain electrode comprises a first region and a second region, the source electrode and the first region of the drain electrode comprises a metal layer and a transparent conductive layer stacked together and having patterns substantially the same with each other, the transparent conductive layer being on a side of the metal layer proximal to the base substrate, the second region comprises the transparent conductive layer, and the transparent conductive layer in the second region serves as a first electrode;
   wherein the second region of the drain electrode does not comprise the metal layer;
   wherein the active layer comprises: a non-conductor region and conductor regions, the non-conductor region corresponding to a gate electrode of the driving transistor, and the conductor regions are respectively connected to the source electrode and the drain electrode, and
   the organic light emitting display substrate further comprises: a light blocking layer disposed between the active layer and the base substrate, wherein the light blocking layer is provided opposite to the active layer to form a capacitor:
   wherein the light blocking layer is electrically connected to the drain electrode;
   wherein the organic light emitting display substrate further comprises a buffer layer disposed between the light blocking layer and the active layer, the light blocking layer is connected to the drain electrode through a second via hole penetrating through the first insulating layer and the buffer layer; and
   wherein the transparent conductive layer and the metal layer stacked together are provided on a bottom and side surfaces of the second via hole.

2. The organic light emitting display substrate of claim 1, wherein the transparent conductive layer and the metal layer stacked together are provided on a bottom and side surfaces of the first via hole.

3. The organic light-emitting display substrate of claim 2, wherein a side of the second region distal to the base substrate is sequentially covered by an organic light-emitting layer and a second electrode, wherein the first electrode, the organic light-emitting layer and the second electrode forms an organic light emitting diode.

4. The organic light emitting display substrate of claim 1, wherein sub-layers of the first insulating layer comprise: an interlayer dielectric layer and a planarization layer.

5. The organic light emitting display substrate of claim 1, further comprising:
a color filter layer corresponding to the second region and located between the transparent conductive layer and the base substrate.

6. The organic light emitting display substrate of claim 1, wherein the light blocking layer is electrically connected to the gate electrode.

7. The organic light emitting display substrate of claim 1, wherein a side surface of the first via hole connects to a side surface of the second via hole such that the first via hole communicates with the second via hole to form a stepped joint via hole.

8. The organic light-emitting display substrate of claim 7, further comprising:
a color filter layer disposed between the buffer layer and the transparent conductive layer, wherein the color filter layer corresponds to the second region, and at least one side of the color filter layer extends to a side surface of the joint via hole.

9. A display device, comprising the organic light emitting display substrate of claim 1.

10. An organic light emitting display substrate, comprising:
a base substrate;
a driving transistor, disposed on the base substrate, wherein the driving transistor comprises:
an active layer;
a first insulating layer having at least one sub-layer covering the active layer and having a first via hole therein;
a source electrode and a drain electrode disposed on a side of the first insulating layer distal to the base substrate, and connected to the active layer through the first via hole in the first insulating layer, wherein the drain electrode comprises a first region and a second region, the source electrode and the first region of the drain electrode comprises a metal layer and a transparent conductive layer stacked together and having patterns substantially the same with each other, the transparent conductive layer being on a side of the metal layer proximal to the base substrate, the second region comprises the transparent conductive layer, and the transparent conductive layer in the second region serves as a first electrode;
wherein the second region of the drain electrode does not comprise the metal layer;
wherein the active layer comprises: a non-conductor region and conductor regions, the non-conductor region corresponding to a gate electrode of the driving transistor, and the conductor regions are respectively connected to the source electrode and the drain electrode, and
the organic light emitting display substrate further comprises: a light blocking layer disposed between the active layer and the base substrate, wherein the light blocking layer is provided opposite to the active layer to form a capacitor; and
wherein the light blocking layer is electrically connected to the gate electrode.

11. The organic light emitting display substrate of claim 10, wherein the transparent conductive layer and the metal layer stacked together are provided on a bottom and side surfaces of the first via hole.

12. The organic light-emitting display substrate of claim 11, wherein a side of the second region distal to the base substrate is sequentially covered by an organic light-emitting layer and a second electrode, wherein the first electrode, the organic light-emitting layer and the second electrode forms an organic light emitting diode.

13. The organic light emitting display substrate of claim 10, wherein sub-layers of the first insulating layer comprise: an interlayer dielectric layer and a planarization layer.

14. The organic light emitting display substrate of claim 10, further comprising:
a color filter layer corresponding to the second region and located between the transparent conductive layer and the base substrate.

15. A display device, comprising the organic light emitting display substrate of claim 10.

* * * * *